(12) United States Patent
Saito et al.

(10) Patent No.: US 7,317,225 B2
(45) Date of Patent: Jan. 8, 2008

(54) POWER SEMICONDUCTOR DEVICE

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/551,526

(22) Filed: Oct. 20, 2006

(65) Prior Publication Data

US 2007/0040217 A1 Feb. 22, 2007

Related U.S. Application Data

(62) Division of application No. 10/961,135, filed on Oct. 12, 2004, now Pat. No. 7,161,209.

(30) Foreign Application Priority Data

Jun. 21, 2004 (JP) ............................. 2004-182216

(51) Int. Cl.
*H01L 29/76* (2006.01)
(52) U.S. Cl. ...................... 257/341; 257/330; 257/328
(58) Field of Classification Search ................ 257/341, 257/330, 328
See application file for complete search history.

(56) References Cited

U.S. PATENT DOCUMENTS 6,410,958 B1 * 6/2002 Usui et al. .................. 257/329

(Continued)

FOREIGN PATENT DOCUMENTS

JP 2000-277726 10/2000

(Continued)

*Primary Examiner*—Laura M. Schillinger
(74) *Attorney, Agent, or Firm*—Oblon, Spivak, McClelland, Maier & Neustadt, P.C.

(57) ABSTRACT

The power semiconductor device according to one embodiment of the present invention at least comprises: first pillar layers of the first conductive type and second pillar layers of a second conductive type which constitute a super-junction structure in a device section and which are arranged alternately in a horizontal direction, each of the first and second pillar layers having a column-shaped sectional structure; third pillar layers of the first conductive type and fourth pillar layers of the second conductive type which are adjacent to the super-junction structure of the device section to constitute another super-junction structure thinner in a vertical direction than the super-junction structure of the device section in a device termination section and which are arranged alternately in a horizontal direction, each of the third and fourth pillar layers having a column-shaped sectional structure; an outermost pillar layer which is stacked on one of the third or fourth pillar layers in the super-junction structure of the device termination section nearest to the device section to be additionally formed to an outermost portion of the super-junction structure of the device section nearest to the device termination section and which has an impurity concentration less than that of each of the first and second pillar layers; a high resistance layer of the first conductive type which is formed on the third pillar layers and the fourth pillar layers and has a resistance value higher than that of each of the first and second pillar layers.

11 Claims, 9 Drawing Sheets

U.S. PATENT DOCUMENTS

| | | | |
|---|---|---|---|
| 6,740,931 B2* | 5/2004 | Kouzuki et al. | 257/341 |
| 6,844,592 B2* | 1/2005 | Yamaguchi et al. | 257/341 |
| 6,878,989 B2* | 4/2005 | Izumisawa et al. | 257/328 |
| 6,888,195 B2* | 5/2005 | Saito et al. | 257/328 |
| 6,995,426 B2* | 2/2006 | Okumura et al. | 257/341 |
| 7,023,050 B2* | 4/2006 | Salama et al. | 257/341 |
| 7,161,209 B2* | 1/2007 | Saito et al. | 257/341 |
| 2002/0063259 A1* | 5/2002 | Usui et al. | 257/110 |
| 2002/0175368 A1* | 11/2002 | Izumisawa et al. | 257/341 |
| 2003/0122222 A1* | 7/2003 | Okumura et al. | 257/653 |
| 2003/0222327 A1* | 12/2003 | Yamaguchi et al. | 257/500 |
| 2004/0012038 A1* | 1/2004 | Kouzuki et al. | 257/200 |
| 2004/0056306 A1* | 3/2004 | Saito et al. | 257/341 |
| 2004/0238844 A1* | 12/2004 | Tokano et al. | 257/197 |
| 2005/0017300 A1* | 1/2005 | Salama et al. | 257/342 |
| 2005/0098826 A1* | 5/2005 | Yamaguchi et al. | 257/341 |
| 2005/0167742 A1* | 8/2005 | Challa et al. | 257/328 |
| 2005/0170587 A1* | 8/2005 | Izumisawa et al. | 438/270 |
| 2005/0224945 A1* | 10/2005 | Saito et al. | 257/686 |
| 2005/0253187 A1* | 11/2005 | Kawamura | 257/328 |
| 2005/0280086 A1* | 12/2005 | Saito et al. | 257/341 |
| 2006/0006458 A1* | 1/2006 | Motai et al. | 257/330 |
| 2006/0011962 A1* | 1/2006 | Kocon | 257/302 |
| 2006/0108600 A1* | 5/2006 | Okumura et al. | 257/135 |
| 2006/0138536 A1* | 6/2006 | Kouzuki et al. | 257/341 |
| 2006/0145290 A1* | 7/2006 | Okumura et al. | 257/529 |
| 2007/0040217 A1* | 2/2007 | Saito et al. | 257/341 |

FOREIGN PATENT DOCUMENTS

JP    2003-115589    4/2003

* cited by examiner

POWER SEMICONDUCTOR DEVICE

CROSS REFERENCE TO RELATED APPLICATION

This application is a Divisional Application of Application Ser. No. 10/961,135 filed Oct. 12, 2004 now U.S. Pat. No. 7,161,209 and claims benefit of priority under Paris Convention from the prior Japanese Patent Application 2004-182216 filed Jun. 21, 2004, the entire contents of which are incorporated herein by reference.

BACKGROUND OF THE INVENTION

1. Field of the Invention

The present invention relates to a power semiconductor device.

2. Related Background Art

An ON resistance of a power semiconductor device, particularly, a vertical type power MOSFET largely depends on electric resistance of a conductive layer (a drift layer) portion. On the other hand, a doping concentration determining the electric resistance of the drift layer can not be raised so as to exceed a limiting value determined according to a breakdown voltage of a p-n junction which a base layer and the drift layer forms. That is, a relationship of a tradeoff is present between a device breakdown voltage and the ON resistance.

In order to realize a power semiconductor device for low power dissipation, it is necessary to reduce an ON resistance while securing device breakdown voltage, namely to improve the relationship of a tradeoff.

As far as the same structure is employed in the power semiconductor device, limitation in improvement depending on device material is present in the relationship of a tradeoff between the device breakdown voltage and the ON resistance. Therefore, in order to exceed the limitation to realize a device having an ON resistance lower than that of an existing power semiconductor device, improvement in structure itself of a power semiconductor device will constitute powerful solving means.

As one example of a structure of a power MOSFET developed to realize a high breakdown voltage and a low ON resistance, one where a super-junction structure with p type pillar layers and n type pillar layers, each pillar layer having a column-like sectional structure, formed alternately is embedded in a drift layer has been known.

In the super-junction structure, a low ON resistance exceeding the limitation in material dependency can be realized by adjusting impurity amounts contained in each p type layer and each n type layer, namely, adjusting impurity concentrations of the p type pillar layer and the n type pillar layer to almost equal values, to form a non-doped layer in a dummy manner and ensure a high breakdown voltage while causing current to flow through the n typed pillar layer heavily doped. Incidentally, in order to ensure a high device breakdown voltage, it is necessary to control the impurity amounts included in the p type pillar layer and the n type pillar layer with a high precision.

Termination structures of a power MOSFET having a drift layer formed with the super-junction structure as described above are roughly classified to two kinds. The first structure lies in that a super-junction structure is formed even in a device termination section. For example, please see Japanese Patent Application Laid-Open No. 2003-115589 Publication. The second structure lies in that a super-junction structure is not formed in a device termination section. For example, see Japanese Patent Application Laid-Open No. 2000-277726 Publication.

A power MOSFET having a device termination section formed with a super-junction structure has such an advantage that, since p type pillar layers and n type pillar layers may be formed with the same mask width over an entire device including even a device section (a cell section) and device termination sections, fluctuation on a process is reduced and it is relatively easy to manufacture such a power MOSFET. However, there is such a problem that, when impurity amounts in each p type pillar layer and each n type pillar layer becomes uneven, a breakdown voltage at the device termination section is reduced largely as compared with a breakdown voltage at the cell section.

On the other hand, in a power MOSFET where a super-junction structure is not formed at a device termination section, lowering of a breakdown voltage at the device termination section when impurity amounts in each p type pillar layer and each n type pillar layer become uneven is relatively small. However, in order to balance an inside of the cell section and an outermost portion of the cell section nearest to the device termination section at a time of depletion layer forming, an impurity concentration of an outermost portion in a super-junction structure, namely, of a p type pillar layer or a n type pillar layer positioned nearest to the device termination section must be adjusted to be lower than that of the other p type pillar layers and n type pillar layers of the cell section, ideally, to be about half thereof.

In the super-junction structure, a depletion layer extends from a junction between the p type pillar layer and the n type pillar layer so that a drift layer is completely depleted at a low voltage. Since n type pillar layers are formed both sides of a p type pillar layer inside the cell section, depletion layers extend from both the sides of the p type pillar layer to join together, thereby forming a depletion layer obtained by complete depletion.

On the other hand, in the outermost pillar layer of the cell section nearest to the device termination section, since an opposite conductive type pillar layer is formed on one side but a high resistance layer is formed on the other side, a depletion layer extends only from one direction.

Accordingly, for forming depletion layers in the inside of the cell section and the outermost portion therein at a time of complete depleting approximately simultaneously, adjustment must be made so as to make a substantial thickness, in a horizontal direction, of the outermost pillar layer thinner than that of each pillar layer inside the cell section, ideally reduce the former to about half of the latter or make an impurity concentration of the outermost pillar layer lower than that of each of the remaining pillar layers, ideally reduce the former to about half of the latter.

However, in order to adjust the impurity concentration in the pillar layer, there is a difficulty on manufacturing, as described below. As a manufacturing method of a power MOSFET where a super-junction structure is not formed in a device termination section, a case of performing ion implantation and embedding crystalline growth, which is a representative process, will be considered. In this case, after ion implantation is performed for a p type pillar layer and n type pillar layer formation, a high resistance layer is formed in an embedding manner by conducting crystalline growth. After these steps are repeated plural times, connection for the pillar layers is performed by diffusion. An impurity amount in the pillar layer is controlled by adjustment of a dose amount of ion implantation and a width of a resist mask.

In order to change the impurity concentration in each p type pillar layer or each n type pillar layer according to its position, it is necessary to change the dose amount of ion implantation according to the position or change an opening width of a mask for ion implantation according to the position.

Now, in a method for changing the dose amount of ion implantation according to the position, the ion implantation and embedding crystalline growth are repeated plural times, as described above, but the ion implantation step for each time must be performed in two-stage manner, which results in lowering in throughput.

On the other hand, when the opening width of the mask for ion implantation is changed according to the position, since ion implantation is simultaneously performed for the inside of the cell section and the outermost pillar layer formation, dose amounts in the respective portions become equal. Accordingly, it becomes necessary to change the opening width of the mask for ion implantation according to the position. That is, an opening width of a mask for the outermost pillar layer formation in the cell section must be smaller than the opening width of the mask for pillar layer formation for the inside of the cell section, for example, the former must be reduced to about half of the latter.

Changing an opening width of a resist mask formed by photolithography according to the position can be easily realized technically.

However, when the resist mask is formed by the photolithography, a difference in size conversion between a reticle and an actual implantation resist mask occurs, so that the opening width of the actual resist mask is eventually different from the size on the reticle.

Fluctuation in size conversion difference in photolithography easily occurs, which causes the same result as fluctuation in impurity amount.

Accordingly, in the power MOSFET where a super-junction structure is not formed in a device termination section, when impurity amounts contained in the p type pillar layer and the n type pillar layer become uneven, lowering of a breakdown voltage in the device termination section is relatively small, but the impurity amounts in the p type pillar layer and the n type pillar layer easily fluctuates on a manufacturing process. As a result, there is such a problem that individuals with a low device breakdown voltage occur easily.

SUMMARY OF THE INVENTION

According to one embodiment of the present invention, there is provided a power semiconductor device comprising:
a drain layer of a first conductive type;
first pillar layers of the first conductive type and second pillar layers of a second conductive type which constitute a super-junction structure on the drain layer of a device section and which are arranged alternately in a horizontal direction, each of the first and second pillar layers having a column-shaped sectional structure;
base layers of the second conductive type which are formed on surface portions of the second pillar layers;
source layers of the first conductive type formed on a surface portion of the base layers;
gate electrodes, each formed through a gate insulating film over a region from one of the source layers formed on the surface portion of one of the base layer to the other of the source layers formed on the surface portion of the other of the base layer adjacent to the one of the base layer via one of the first pillar layers;
third pillar layers of the first conductive type and fourth pillar layers of the second conductive type which are adjacent to the super-junction structure of the device section to constitute another super-junction structure thinner in a vertical direction than the super-junction structure of the device section on the drain layer of a device termination section and which are arranged alternately in a horizontal direction, each of the third and fourth pillar layers having a column-shaped sectional structure;
an outermost pillar layer which is stacked on one of the third or fourth pillar layers in the super-junction structure of the device termination section nearest to the device section to be additionally formed to an outermost portion of the super-junction structure of the device section nearest to the device termination section and which has an impurity concentration less than that of each of the first and second pillar layers;
a high resistance layer of the first conductive type which is formed on the third pillar layers and the fourth pillar layers and has a resistance value higher than that of each of the first and second pillar layers and the base layers;
a source electrode which is formed to be electrically connected with the base layers and the source layers; and
a drain electrode which is formed on a back face of the drain layer.

According to another embodiment of the present invention, there is provided a power semiconductor device comprising:
a drain layer of a first conductive type;
first pillar layers of the first conductive type and second pillar layers of a second conductive type which constitute a super-junction structure on the drain layer of a device section, each of which has a column-shaped sectional structure by stacking and integrated unit first pillar layers of the first conductive type and unit second pillar layers of the second conductive type, respectively, and which are alternately disposed in a horizontal direction;
base layers of the second conductive type which are formed on surface portions of the second pillar layers;
source layers of the first conductive type formed on a surface portion of the base layers;
gate electrodes, each formed through a gate insulating film over a region from one of the source layers formed on the surface portion of one of the base layer to the other of the source layers formed on the surface portion of the other of the base layer adjacent to the one of the base layer via one of the first pillar layers;
an outermost pillar layer which has a column-shaped sectional structure by stacking and integrated outermost unit pillar layers formed with a density lower than that of the unit first pillar layers and the unit second pillar layers constituting each of the first pillar layers and the second pillar layers and which is additionally formed at an outermost portion of the super-junction structure of the device section nearest to the device termination section;
a high resistance layer of the first conductive type which is formed on the drain layer of the device termination section adjacent to the device section and which has a resistance value higher than that of each of the first pillar layers, the second pillar layers and the base layers;
a source electrode which is formed to be electrically connected with the base layers and the source layers;
a drain electrode which is formed on a back face of the drain layer.

DETAILED DESCRIPTION OF THE EMBODIMENTS

Figure 1:
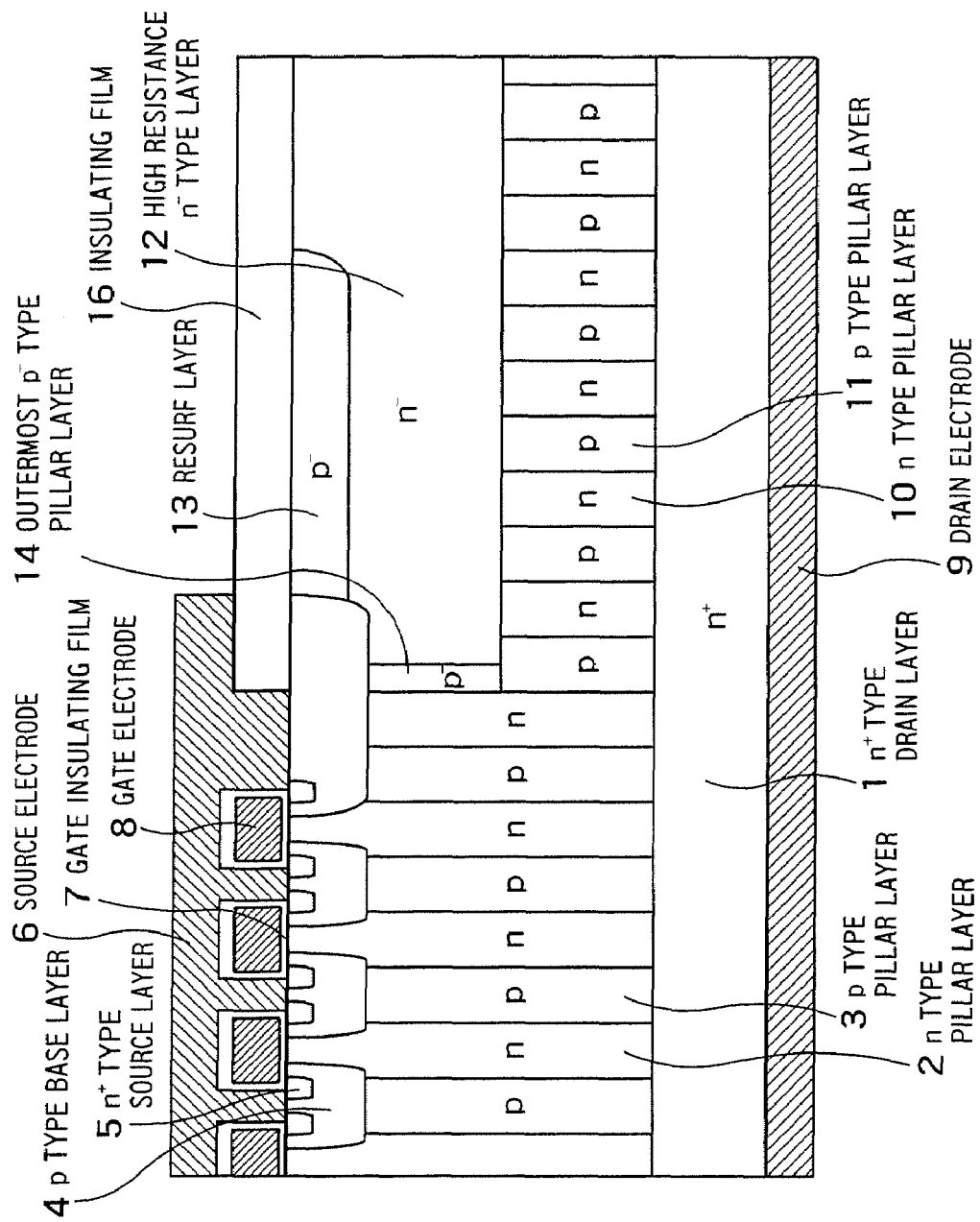
FIG. 1 is a sectional view showing a structure of a power semiconductor device according to a first embodiment of the present invention.

Embodiment of a power semiconductor device according to the present invention will be explained below with reference to the drawings. In each of the embodiments described below, explanation will be made with definition of a first conductive type as an n type and definition of a second conductive type as a p type. In the drawings, same or similar portions or parts are attached with the same reference numerals.

FIG. 1 is a sectional view showing a structure of a power semiconductor device according to a first embodiment of the present invention.

The power semiconductor device according to the first embodiment according of the present invention comprises: an $n^+$ type drain layer 1; n type pillar layers 2 and p type pillar layers 3 which constitute a super-junction structure on the $n^+$ type drain layer 1 of a device section and which are arranged alternately in a horizontal direction, each of the n type pillar layers 2 and the p type pillar layers 3 having a column-shaped sectional structure; p type base layers 4 which are formed on surface portions of the p type pillar layers 3; $n^+$ type source layers 5 formed on a surface portion of the p type base layer 4; gate electrodes 8, each formed through a gate insulating film 7 over a region from one of the $n^+$ type source layers 5 formed on the surface portion of one of the p type base layer 4 to the other of the $n^+$ type source layers 5 formed on the surface portion of the other of p type base layers 4 adjacent to the one of the p type base layer 4 via one of the n type pillar layer 2; n type pillar layers 10 and p type pillar layers 11 which are adjacent to the super-junction structure of the device section to constitute another super-junction structure thinner in a vertical direction than the super-junction structure of the device section on the $n^+$ type drain layer 1 of a device termination section and which are arranged alternately in a horizontal direction, each of the pillar layers 10 and 11 having a column-shaped sectional structure; an outermost p type pillar layer 14 which is stacked on the n type pillar layer 10 or the p type pillar layer 11 in the super-junction structure of the device termination section nearest to the device section to be additionally formed to an outermost portion of the super-junction structure of the device section nearest to the device termination section and which has an impurity concentration and/or a substantial thickness in a horizontal direction which is about half of that of each of the n type pillar layers 2 and the p type pillar layers 3; a high resistance n type layer 12 which is formed on the n type pillar layers 10 and the p type pillar layers 11 and has a resistance value higher than that of each of the n type pillar layers 2, the p type pillar layers 3 and the p type base layers 4; a RESURF (REduced SURface Field) layer 13 formed on a surface portion of the high resistance n type layer 12; an insulating film 16 which is formed to cover the high resistance n type layer 12, the RESURF layer 13, and one of the p type base layers 4 positioned in a boundary portion between the device section and the device termination section; a source electrode 6 which is formed to be electrically connected with the p type base layers 4 and the $n^+$ type source layers 5; and a drain electrode 9 which is formed on a back face of the $n^+$ type drain layer 1.

As described above, each of the n type pillar layer 2, the p type pillar layer 3, the n type pillar layer 10 and the p type pillar layer 11 has the column-shaped sectional structure in section in a vertical direction, and it has a stripe-shaped sectional structure in section in a horizontal direction. Each of the p type base layer 4 and the $n^+$ type source layer 5 also has a stripe-shaped sectional structure in section in a horizontal direction.

As the gate insulating film 7 formed among the n type pillar layer 2, the p type base layer 4, the $n^+$ type source layer 5, and the gate electrode 8, a silicon oxide film with a thickness of about 0.1 μm may be formed, for example.

The gate electrode 8 serving as a control electrode also has a stripe-shaped sectional structure in section in a horizontal direction.

The source electrode 6 is formed so as to be sandwiched between respective gate electrodes 8 and it has a stripe-shaped sectional structure in section in a horizontal direction. The source electrode 6 and the drain electrode 9 serve as first and second main electrodes, respectively.

In the device termination section, the super-junction structure thinner in a vertical direction than the super-junction structure of the device section is formed adjacent to the super-junction structure of the device section on the basis of an upper face of the $n^+$ type drain layer 1. The super-junction structure of the device section is constituted of the n type pillar layers 2 and the p type pillar layers 3, and the super-junction structure of the device termination section is constituted of the n type pillar layers 10 and the p type pillar layers 11.

The outermost p type pillar layer 14 is additionally formed at an outermost portion of the super-junction structure of the device section nearest to the device termination section where the super-junction structure of the device termination section is not formed, namely, the super-junction structure of the device section is adjacent to the high resistance n type layer 12. Therefore, the outermost p type pillar layer 14 is stacked on the n type pillar layer 10 or the p type pillar layer 11 of the super-junction structure of the device termination section nearest to the device section, on the p type pillar layer 11 in the example shown in FIG. 1. Since the high resistance n type layer 12 is formed on the surface portion of the device termination section, the outermost p type pillar layer 14 is formed on a boundary portion between an upper portion of the super-junction structure of the device section and the high resistance n type layer 12 of the device termination section.

In FIG. 1, the outermost p type pillar layer 14 is shown such that its substantial thickness in a horizontal direction is set to be about half of the thickness of each of the n type pillar layers 2 and the p type pillar layers 3, which means that an impurity concentration of the outermost p type pillar layer 14 is about half of an impurity concentration of each of the n type pillar layer 2 and the p type pillar layer 3. The reason why the impurity concentration of the outermost p type pillar layer 14 is adjusted to about half of the impurity concentration of each of the n type pillar layers 2 and the p type pillar layers 3 is as described above. Such a constitution that the impurity concentration in the outermost p type pillar layer 14 is about half of that of the n type pillar layer 2 and the p type pillar layer 3 is ideal, but the former should be set to be at least lower than the latter. Accordingly, such a constitution that the substantial thickness of the outermost p type pillar layer 14 in the horizontal direction is about half of that of each of the n type pillar layer 2 and the p type pillar layer 3 is ideal, but the former should be set to be at least thinner than the latter. Here, the conductive type of the outermost pillar layer 14 has been set to p type, but it may be n type.

This embodiment is different from any conventional structure in that the outermost p type pillar layer 14 is provided.

Figure 2:
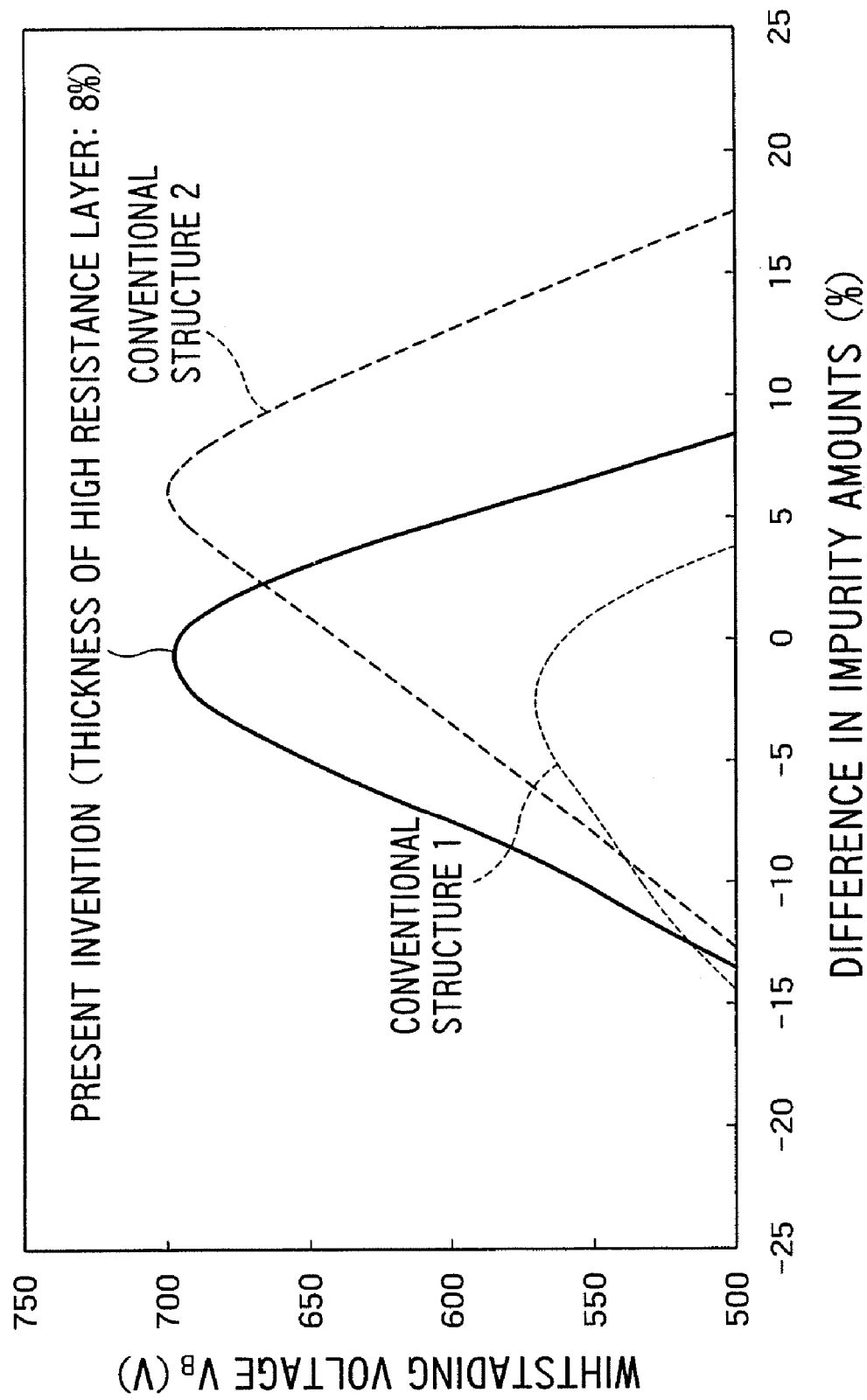
FIG. 2 is a graph showing breakdown voltage characteristics of the power semiconductor device according to the first embodiment of the present invention and the power semiconductor devices with the conventional structure.

FIG. 2 is a graph showing breakdown voltage characteristics of the power semiconductor device according to the first embodiment of the present invention and the power semiconductor devices with the conventional structure. Specifically, FIG. 2 is a graph representing a relationship between a difference (%) between impurity amounts contained in the n type pillar layer 2 and the p type pillar layer 3 constituting the super-junction structure in both the devices and a device breakdown voltage. The difference between the impurity amounts in the n type pillar layer 2 and the p type pillar layer 3 means variations in impurity amounts in the both layers.

FIG. 2 shows three curves representing breakdown voltage characteristics of the power semiconductor device according to the first embodiment of the present invention and two power semiconductor devices having conventional structures 1 and 2. Here, the conventional structure 1 is a structure where a super-junction structure is formed even in a device termination section quite like the device section (the cell section), and the conventional structure 2 is a structure where a super-junction structure is not formed in the device termination section but a super-junction structure is formed only in the device section (the cell section). The conventional power semiconductor device 2 having a super-junction structure is classified to one of the two types.

In an ideal super-junction structure, the impurity amounts in the n type pillar layer 2 and the p type pillar layer 3, i.e., the impurity concentrations in the n type pillar layer 2 and the p type pillar layer 3 are equal to each other. However, when a device is actually produced, impurity amounts in the n type pillar layer 2 and the p type pillar layer 3 do not become equal due to fluctuation on a manufacturing process.

When the impurity amounts in the n type pillar layer 2 and the p type pillar layer 3 are approximately equal to each other, the highest device breakdown voltage can be obtained, but the breakdown voltage lowers according to increase in difference between the impurity amounts in both the layers.

In the conventional structure 1, since the super-junction structure is similarly formed in both of the device section and the device termination section, manufacturing is relatively easy and a fluctuation in impurity amount contained in each of the n type pillar and the p type pillar hardly occurs. However, the conventional structure 1 has a characteristic that, when the impurity amounts in both the layers become non-equal, the device breakdown voltage lowers remarkably. Since a high resistance layer is not formed in the device termination section, the maximum device breakdown voltage which can be achieved is originally low.

On the other hand, in the conventional structure 2, since a super-junction structure is formed only in the device section and the high resistance layer is formed in the device termination section instead of a super-junction structure, a change of the device breakdown voltage to change in difference between the impurity amounts in the n type pillar layer 2 and the p type pillar layer 3 is small. However, since it is necessary to form the outermost pillar layer including about half of the impurity amount contained in each pillar layer in the device section, a fluctuation in impurity amount in each pillar layer easily occurs on a manufacturing process, as described above.

The power semiconductor device according to the first embodiment of the present invention is intended to take the respective advantages or merits of the conventional structures 1 and 2 therein by employing such a structure that change of the device breakdown voltage to change in difference among impurity amounts in the respective pillar layers is small and fluctuations in respective pillar layers are suppressed from occurring, as such as described above.

That is, in the power semiconductor device according to the first embodiment of the present invention, first, the high resistance n type layer 12 is formed on the surface portion of the device termination section so that influence due to the fluctuation in impurity amount in the super-junction structure can be reduced on a surface where the strongest electric field serves.

In the device termination section, the thickness of the outermost p type pillar layer 14 in a vertical direction is made thin by forming the super-junction structure up to a predetermined thickness from the $n^+$ type drain layer 1. The ion implantation and embedding crystalline growth must be repeated plural times in order to form the device section including the outermost p type pillar layer 14, and the super-junction structure and the high resistance n type layer 12 in the device termination section, as described above, but the number of ion implantation times for forming the outermost p type pillar layer 14 can be reduced owing to reduction of the size of the outermost p type pillar layer 14 in the vertical direction. Since fluctuation in impurity amount in the outermost p type pillar layer 14 depends on accumulation of fluctuations in impurity amount for respective ion implantation steps for forming the outermost p type pillar layer 14, fluctuation of the impurity amount in the outermost p type pillar layer 14 can be made small by reducing the number of ion implantation steps. Since such a fact that the thickness of the outermost p type pillar layer 14 in the vertical direction is thin means that the total of the impurity amount in the outermost p type pillar layer 14 decreases, the impurity amount corresponding to the fluctuation also decreases, which results in suppression of lowering in device breakdown voltage.

Accordingly, the structure of the power semiconductor device according to the first embodiment of the present invention shown in FIG. 1 can suppress lowering in device breakdown voltage due to fluctuation on a manufacturing process.

Since electric field concentration on an end portion of the p type base layer 4 is relaxed by the RESURF layer 13 formed adjacent to the p type base layer 4 formed at the boundary portion between the device section and the device termination section, the RESURF layer 13 also contributes to suppression of lowering in device breakdown voltage. Incidentally, the RESURF layer 13 may be present or absent in this embodiment.

Breakdown voltage characteristic of the power semiconductor device according to the first embodiment of the present invention shown in FIG. 2 shows a relationship between the device breakdown voltage and a difference in impurity amount, that is, the fluctuation obtained when the thickness of the high resistance n type layer 12 formed on the surface portion of the device termination section is set to 8% of the super-junction structure in the device section (the cell section), namely, the thickness of the drift layer.

In comparison with the breakdown voltage characteristic in the conventional structure 2, the breakdown voltage characteristic of the power semiconductor device according to the first embodiment of the present invention shows the fact that the maximum breakdown voltage generally equal to that in the conventional structure 2 is obtained, a value of the difference in impurity amount where the maximum breakdown voltage can be obtained is almost 0%, and a sufficient breakdown voltage is achieved in a range of 0±5%. Accordingly, assuming that the impurity amount included in the outermost p type pillar layer 14 is set to 50% of the impurity amount included in each of the n type pillar layer 2 and the p type pillar layer 3, a sufficient device breakdown voltage can be obtained even if the numerical value of the impurity amount fluctuates in a range of about 45% to 55%.

Further, the structure of the power semiconductor device according to the first embodiment of the present invention is different from the conventional structure 2 where the super-junction structure is formed only in the device section, and it has a structure where fluctuation due to a manufacturing process hardly occurs in the impurity amount included in each pillar layer, particularly, in the impurity amount included in the outermost p type pillar layer 14. Accordingly, the graph shows that the maximum breakdown voltages of the power semiconductor device according to the first embodiment of the present invention and the conventional structure 2 are generally equal to each other, but the power semiconductor device according to the first embodiment of the present invention has such a characteristic that breakdown voltage lowering due to fluctuation in impurity amount is suppressed from occurring, as compared with the case of the conventional structure 2.

In comparison with the conventional structure 1 where the super-junction structure is formed in both the device section and the device termination section, it is apparent that the power semiconductor device according to the first embodiment of the present invention can obtain a breakdown voltage higher than that obtained in the conventional structure 1.

Figure 3:
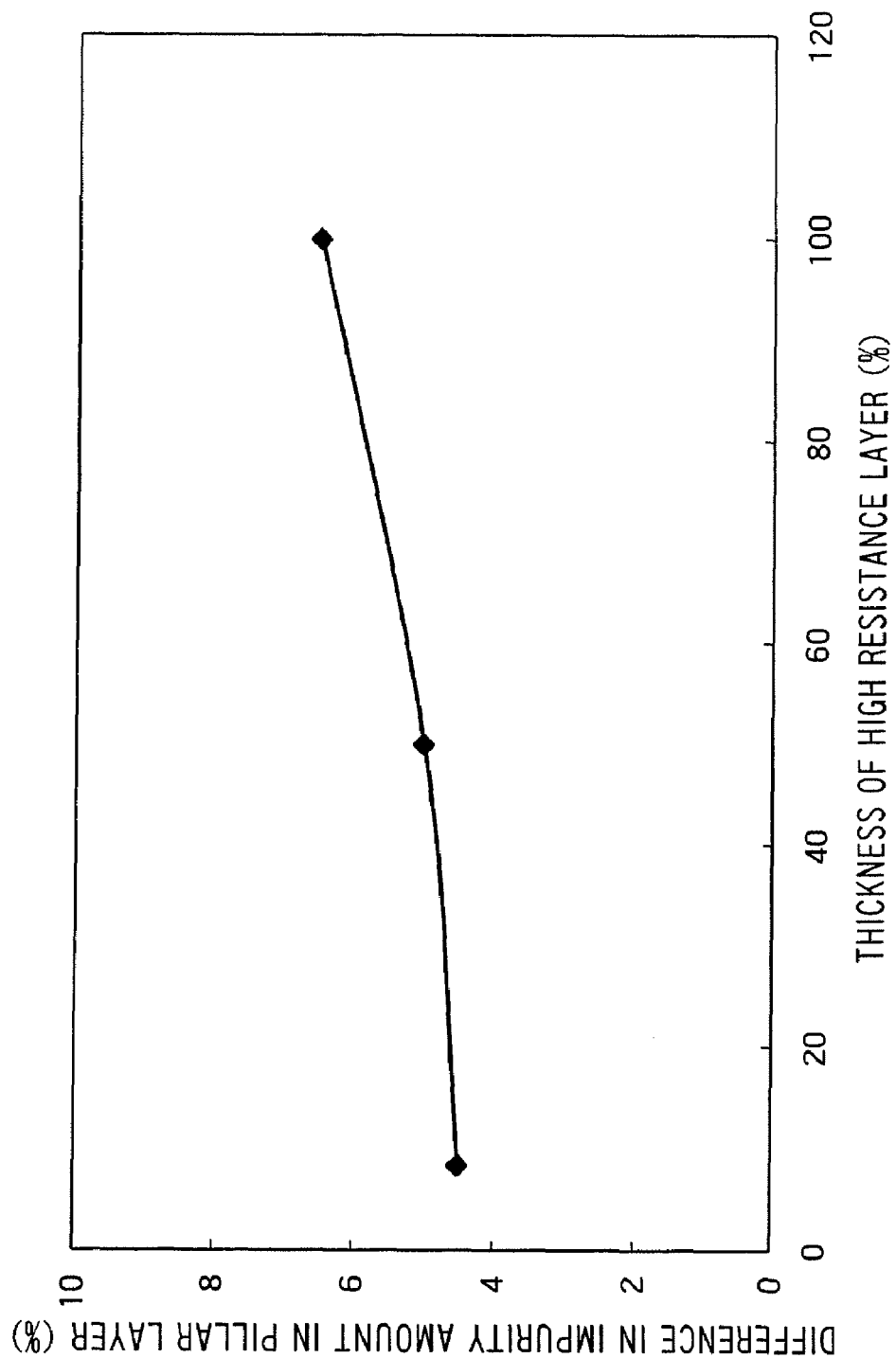
FIG. 3 is a graph showing a relationship between a change in thickness of the high resistance layer formed on the device termination section of the power semiconductor device according to the first embodiment of the present invention and a margin to a difference in impurity amount in a pillar layer.

FIG. 3 is a graph showing a relationship between a change in thickness of the high resistance layer formed on the device termination section of the power semiconductor device according to the first embodiment of the present invention and a margin to a difference in impurity amount in a pillar layer.

Here, an optimal thickness of the high resistance n type layer 12 formed on the device termination section of the power semiconductor device according to the first embodiment of the present invention will be described. The graph in FIG. 3 shows, as the result of examination about the degree of change in device breakdown voltage occurring when the thickness of the high resistance n type layer 12 is changed, that a difference in impurity amount which makes it possible to realize a breakdown voltage of 90% or more of the maximum breakdown voltage is expressed as a margin, namely, an allowable error.

As shown in the graph in FIG. 3, in the power semiconductor device according to the first embodiment of the present invention, even when the thickness of the high resistance n type layer 12 formed in the device termination section is changed, the margin to the difference in impurity amount in the pillar layer hardly changes.

Accordingly, assuming that the thickness of the high resistance n type layer 12 formed in the device termination section of the conventional structure 2 where the super-junction structure is formed only in the device section is 100%, when the thickness of the high resistance n type layer 12 formed in the device termination section of the power semiconductor device according to the first embodiment of the present invention is set in a range of 8% or more to less than 100%, a performance substantially equal to the characteristic of the power semiconductor device according to the first embodiment of the present invention shown in FIG. 2 can be obtained.

On the other hand, when the thickness of the high resistance n type layer 12 formed in the device termination section of the power semiconductor device according to the first embodiment of the present invention is set to less than 8% by further thinning the high resistance n type layer 12, the structure of the power semiconductor device according to the first embodiment of the present invention gradually approximates to the conventional structure 1 where the super-junction structure is formed even in the device termination section like the device section. Regarding the degree of thinning the high resistance n type layer 12 for obtaining the performance equivalent to that in the conventional structure 1, the depth of the junction of the p type base layer 4 serving as an avalanche point constitutes a reference. When a bottom portion of the p type base layer 4 formed in the boundary portion between the device section and the device termination section is in contact with the super-junction structure, the device breakdown voltage is easily influenced by fluctuation in impurity amount in the super-junction structure. However, when the bottom portion of the p type base layer 4 is in contact with the high resistance n type layer 12, influence of fluctuation in impurity amount in the super-junction structure on the device breakdown voltage is reduced.

Consideration will be made regarding a relationship between the thickness of the high resistance n type layer 12 and that of the p type base layer 4.

Figure 4:
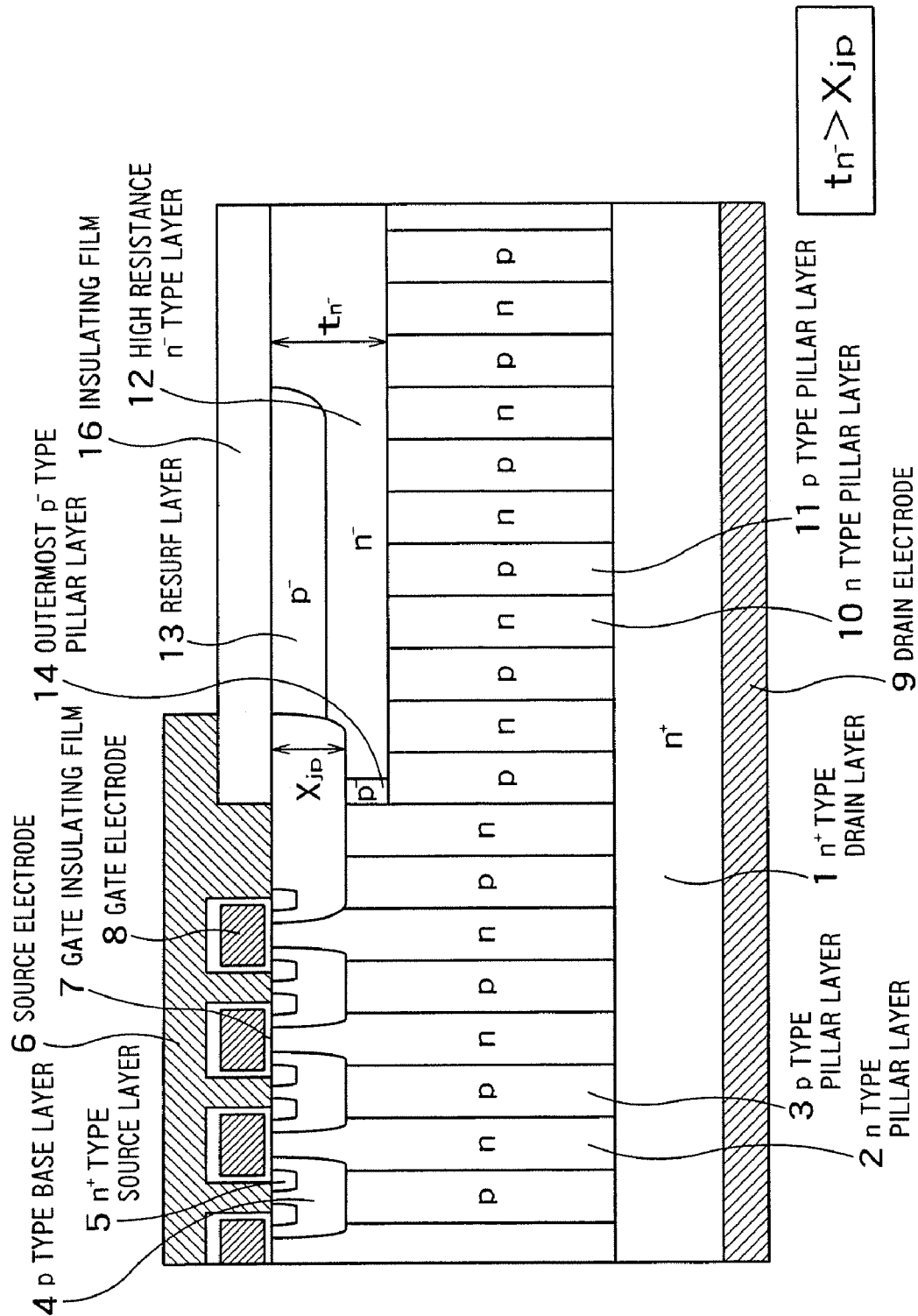
FIG. 4 is a sectional view illustratively showing a relationship between the thickness of the high resistance n type layer 12 and that of the p type base layer 4 to be satisfied in the power semiconductor device according to the first embodiment of the present invention.

FIG. 4 is a sectional view illustratively showing a relationship between the thickness of the high resistance n type layer 12 and that of the p type base layer 4 to be satisfied in the power semiconductor device according to the first embodiment of the present invention.

In order to suppress influence from fluctuation in impurity amount in a super-junction structure effectively, it is necessary to isolate, from the super-junction structure, a bottom portion of the p type base layer 4 formed from the boundary portion between the device section and the device termination section to the device termination section.

Therefore, as shown in FIG. 4, it is necessary to form the high resistance n type layer 12 and the p type base layer 4 in such a structure that a thickness $tn^-$ of the high resistance n type layer 12 becomes larger than the thickness Xjp of the p type base layer 4, namely, an inequality $tn^->Xjp$ is satisfied.

Though not illustrated, since the depletion layer does not extend up to a portion far from the RESURF layer 13 in a distance of 50 μm or more, even when a high voltage is applied to the device, it is desirable to form a channel stopper layer on a surface portion without forming an n type pillar layer 10 and a p type pillar layer 11 in the vicinity of a peripheral portion of the device.

As described above, according to the power semiconductor device according to the first embodiment of the present invention, since such a constitution is employed that the high resistance layer is formed on the surface portion in the device termination section and the super-junction structure is formed between the drain layer and the high resistance layer, and the outermost pillar layer having an impurity concentration with a value of about half of that of each pillar layer constituting the super-junction structure is formed only in the boundary portion between the super-junction structure in the device section and the high resistance layer, lowering of the device breakdown voltage due to fluctuation in impurity concentration of each pillar layer caused by fluctuation on a manufacturing process can be suppressed and the fluctuation itself in impurity concentration of each pillar layer can be suppressed. As a result, a power semiconductor device with a high breakdown voltage having a super-junction structure in a device section can be realized or provided.

Figure 5:
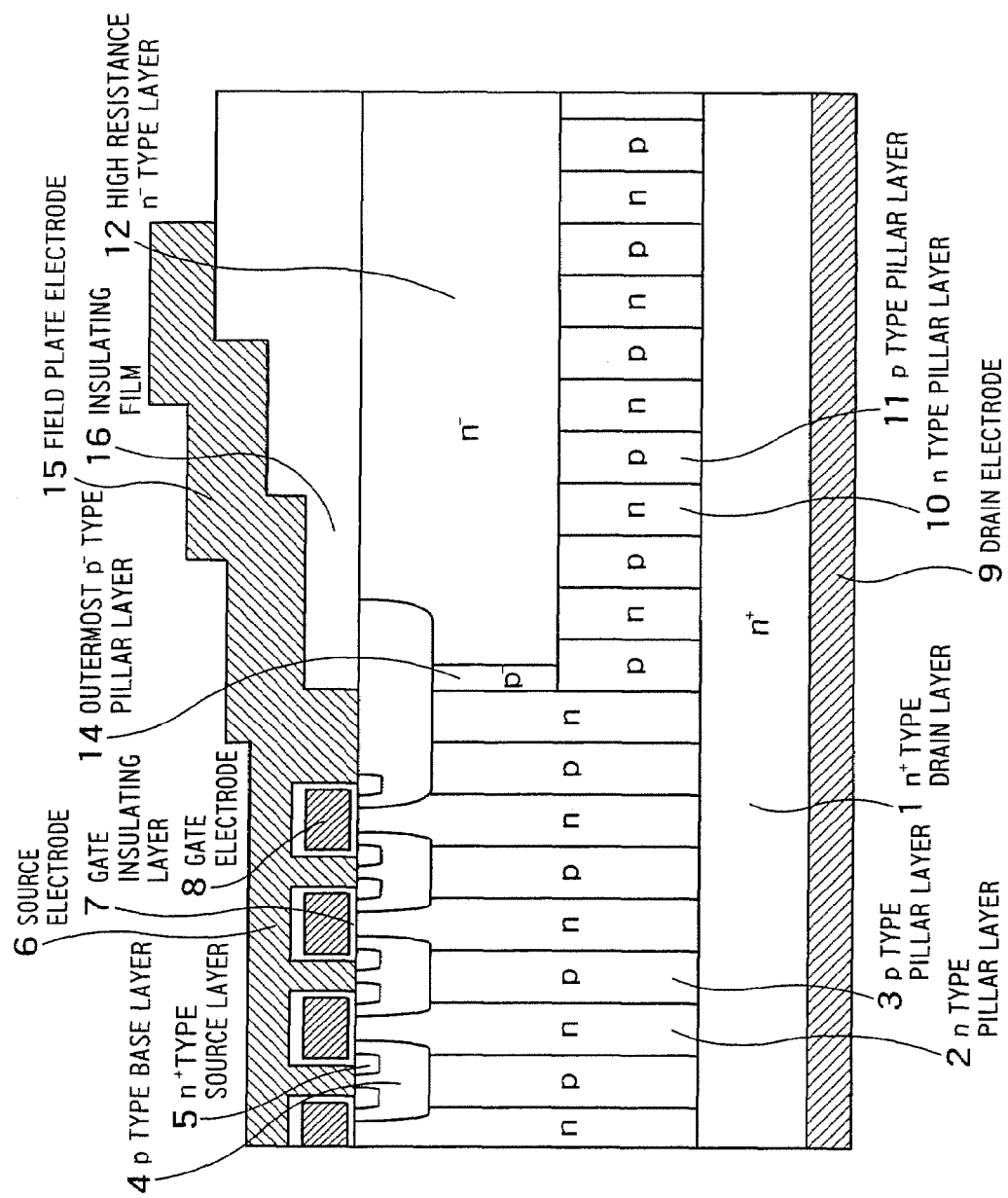
FIG. 5 is a sectional view showing a structure of a power semiconductor device according to a second embodiment of the present invention.

FIG. 5 is a sectional view showing a structure of a power semiconductor device according to a second embodiment of the present invention.

The power semiconductor device according to the second embodiment according of the present invention comprises: an $n^+$ type drain layer 1; n type pillar layers 2 and p type pillar layers 3 which constitute a super-junction structure on the $n^+$ type drain layer 1 of a device section and which are arranged alternately in a horizontal direction, each of the n type pillar layers 2 and the p type pillar layers 3 having a column-shaped sectional structure; p type base layers 4 which are formed on surface portions of the p type pillar layers 3; $n^+$ type source layers 5 formed on a surface portion of the p type base layers 4; gate electrodes 8, each formed through a gate insulating film 7 over a region from one of the $n^+$ type source layers 5 formed on the surface portion of one of the p type base layers 4 to the other of the $n^+$ type source layers 5 formed on the surface portion of the other of the p type base layers 4 adjacent to the one of the p type base layers 4 via one of the n type pillar layers 2; n type pillar layers 10 and p type pillar layers 11 which are adjacent to the super-junction structure of the device section to constitute another super-junction structure thinner in a vertical direction than the super-junction structure of the device section on the $n^+$ type drain layer 1 of a device termination section and which are arranged alternately in a horizontal direction, each of the pillar layers 10 and 11 having a column-shaped sectional structure; an outermost p type pillar layer 14 which is stacked on the n type pillar layer 10 or the p type pillar layer 11 in the super-junction structure of the device termination section nearest to the device section to be additionally formed to an outermost portion of the super-junction structure of the device section nearest to the device termination section and which has an impurity concentration and/or a substantial thickness in a horizontal direction which is about half of that of each of the n type pillar layers 2 and the p type pillar layers 3; a high resistance n type layer 12 which is formed on the n type pillar layers 10 and the p type pillar layers 11 and has a resistance value higher than that of each of the n type pillar layers 2, the p type pillar layers 3 and the p type base layers 4; an insulating film 16 which is formed so as to cover the high resistance n type layer 12 and one of the p type base layers 4 positioned in the boundary portion between the device section and the device termination section and such that a film thickness of the insulating film 16 gradually becomes thicker toward a peripheral portion of the device; a source electrode 6 which is formed to be electrically connected with the p type base layers 4 and the $n^+$ type source layers 5; a field plate electrode 15 which is formed so as to expand the source electrode 6 up to the device termination section and to cover the insulating film 16; and a drain electrode 9 which is formed on a back face of the $n^+$ type drain layer 1.

Since the power semiconductor device according to the second embodiment of the present invention has, in most part, a constitution similar to that of the power semiconductor device according to the first embodiment of the present invention, only different constituent portions or parts will be explained below.

In the semiconductor device according to the first embodiment of the present invention, the RESURF layer 13 is formed on the surface portion of the high resistance n type layer 12 in the device termination section, while the RESURF layer 13 is not formed but the field plate electrode 15 expanding the source electrode 6 up to the device termination section to cover the insulating film 16 is instead formed in the power semiconductor device according to the second embodiment of the present invention.

By covering a periphery of the p type base layer 4 formed in the boundary portion between the device section and the device termination section with the field plate electrode 15, electric field concentration on an end portion of the p type base layer 4 is relaxed, so that the field plate electrode 15 can also contribute to suppression of device breakdown voltage lowering like the RESURF layer 13.

Though not illustrated, since, even if the device is applied with a high voltage, a depletion layer does not extend up to a portion of the device far from the field plate electrode 15 in a distance of 50 μm or more, it is desirable to form a channel stopper layer on a surface portion in the vicinity of a peripheral portion of the device without forming the n type pillar layer 10 and the p type pillar layer 11.

Figure 6:
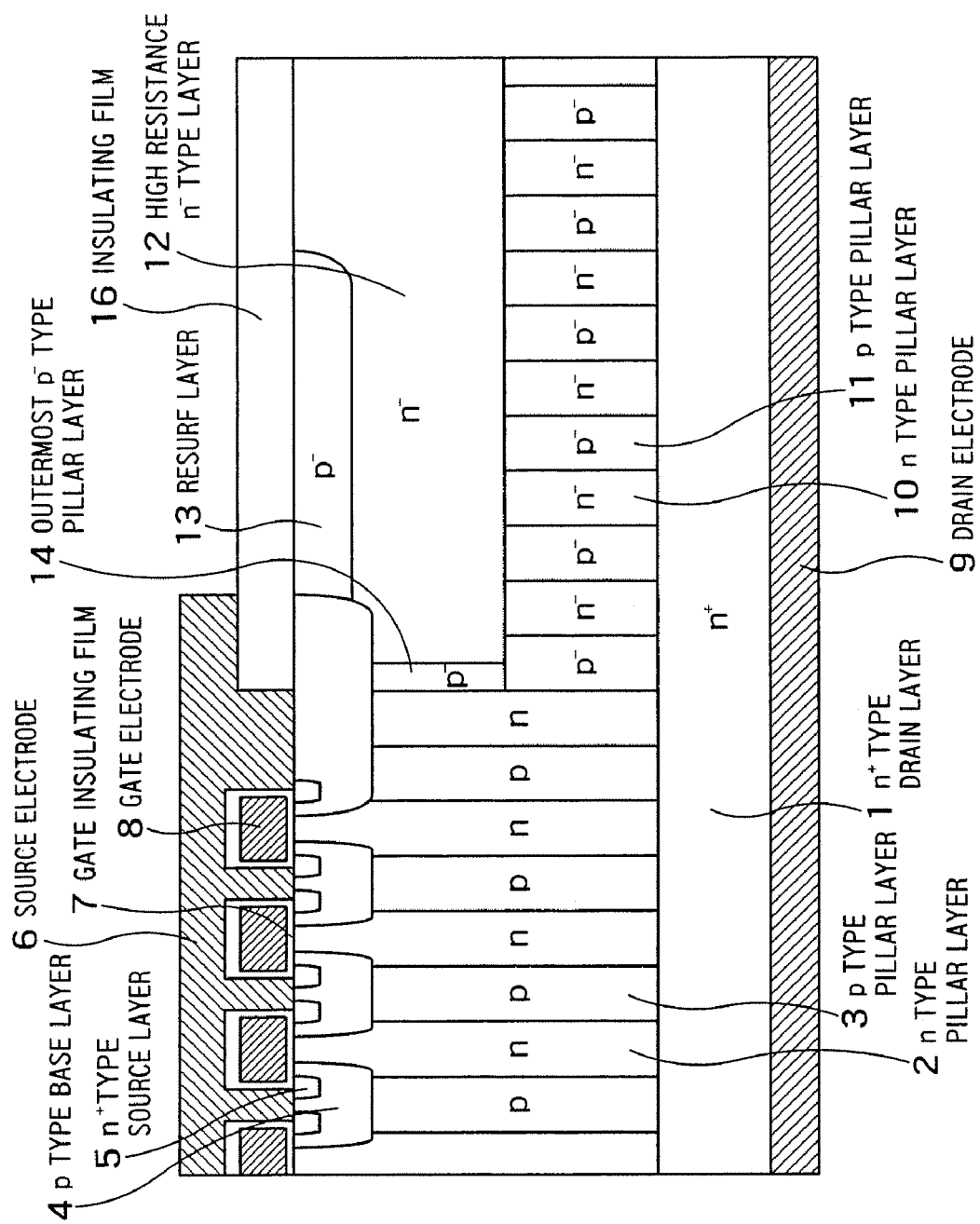
FIG. 6 is a sectional view showing a structure of a power semiconductor device according to a third embodiment of the present invention.

FIG. 6 is a sectional view showing a structure of a power semiconductor device according to a third embodiment of the present invention.

The power semiconductor device according to the third embodiment according of the present invention comprises: an $n^+$ type drain layer 1; n type pillar layers 2 and p type pillar layers 3 which constitute a super-junction structure on the $n^+$ type drain layer 1 of a device section and which are arranged alternately in a horizontal direction, each of the n type pillar layers 2 and the p type pillar layers 3 having a column-shaped sectional structure; p type base layers 4 which are formed on surface portions of the p type pillar layers 3; $n^+$ type source layers 5 formed on a surface portion of the p type base layers 4; gate electrodes 8, each formed through a gate insulating film 7 over a region from one of the $n^+$ type source layers 5 formed on the surface portion of one of the p type base layers 4 to the other of the $n^+$ type source layers 5 formed on the surface portion of the other of the p type base layers 4 adjacent to the one of the p type base layer 4 via one of the n type pillar layers 2; n type pillar layers 10 and p type pillar layers 11 which are adjacent to the super-junction structure of the device section to constitute another super-junction structure thinner in a vertical direction than the super-junction structure of the device section on the $n^+$ type drain layer 1 of a device termination section, each of which has an impurity concentration lower than that in each of the n type pillar layers 2 and the p type pillar layers 3, and which are arranged alternately in a horizontal direction, each of the pillar layers 10 and 11 having a column-shape sectional structure; an outermost p type pillar layer 14 which is stacked on the n type pillar layer 10 or the p type pillar layer 11 in the super-junction structure of the device termination section nearest to the device section to be additionally formed to an outermost portion of the super-junction structure of the device section nearest to the device termination section and which has an impurity concentration and/or a substantial thickness in a horizontal direction which is about half of that of each of the n type pillar layers 2 and the p type pillar layers 3; a high resistance n type layer 12 which is formed on the n type pillar layers 10 and the p type pillar layers 11 and has a resistance value higher than that of each of the n type pillar layers 2, the p type pillar layers 3 and the p type base layers 4; a RESURF (REduced SURface Field) layer 13 formed on a surface portion of the high resistance n type layer 12; an insulating film 16 which is formed to cover the high resistance n type layer 12, the RESURF layer 13, and one of the p type base layers 4 positioned in a boundary portion between the device section and the device termination section; a source electrode 6 which is formed to be electrically connected with the p type base layers 4 and the $n^+$ type source layers 5; and a drain electrode 9 which is formed on a back face of the $n^+$ type drain layer 1.

The power semiconductor device according to the third embodiment of the present invention has, in most part, a constitution similar to that of the power semiconductor device according to the first embodiment of the present invention, only different constituent portions or parts will be explained below.

The power semiconductor device according to the third embodiment of the present invention is different from the power semiconductor device according to the first embodiment of the present invention in that the impurity concentration of each of the n type pillar layers 10 and the p type pillar layers 11 constituting the super-junction structure formed in the device termination section is set to be lower than that of each of the n type pillar layers 2 and the p type pillar layers 3 constituting the super-junction structure formed in the device section in the former.

The impurity concentration of each of the n type pillar layers 10 and the p type pillar layers 11 can be lowered by changing the opening width of a mask for ion implantation like the outermost p type pillar layer 14.

By lowering the impurity concentration of each of the n type pillar layers 10 and the p type pillar layers 11 constituting the super-junction structure formed in the device termination section, lowering of the device breakdown voltage due to fluctuation of a difference between impurity concentrations in each n type pillar layer 10 and in each p type pillar layer 11 can be suppressed.

Figure 7:
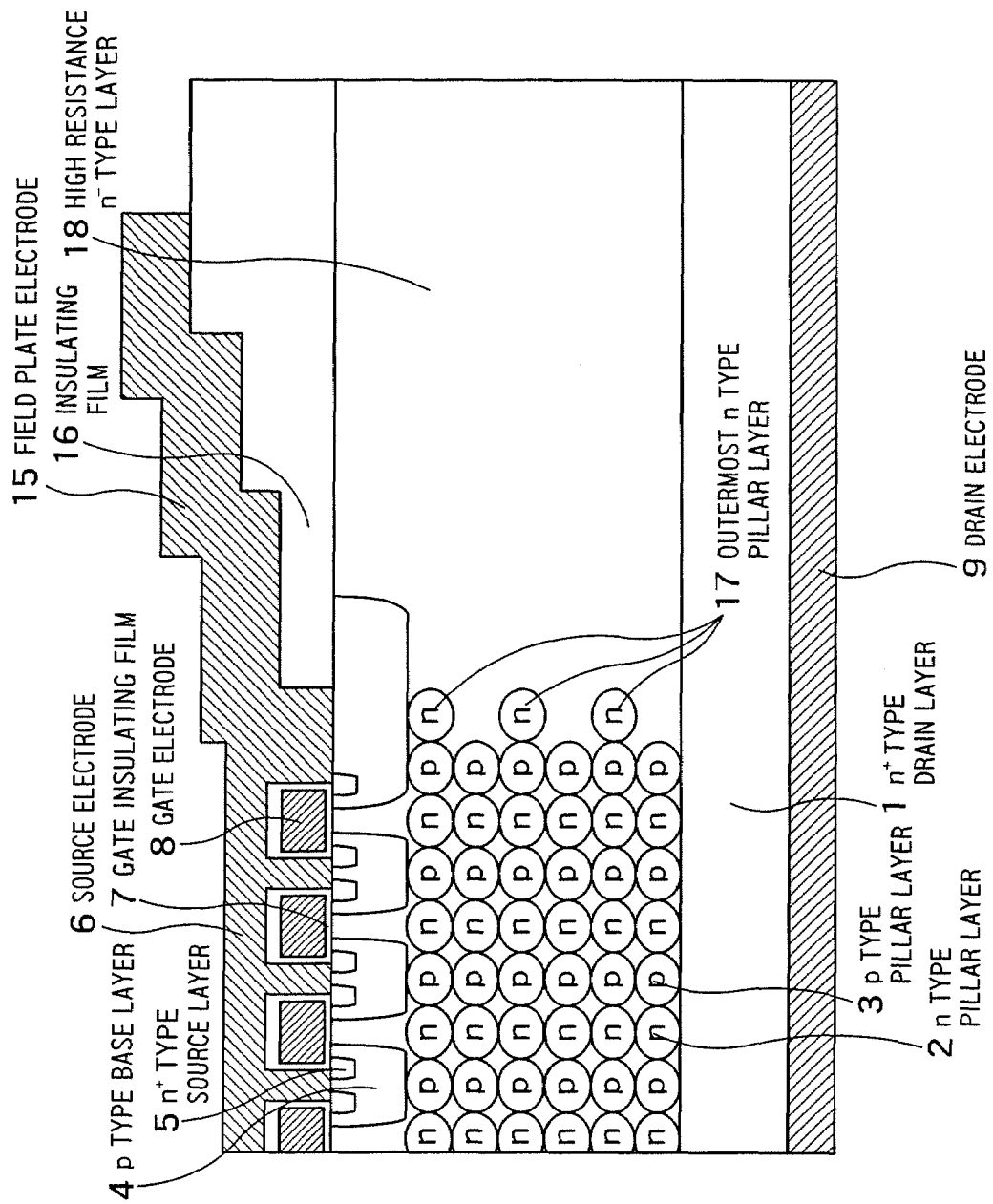
FIG. 7 is a sectional view showing a structure of a power semiconductor device according to a fourth embodiment of the present invention.

FIG. 7 is a sectional view showing a structure of a power semiconductor device according to a fourth embodiment of the present invention.

The power semiconductor device according to the fourth embodiment according of the present invention comprises: an $n^+$ type drain layer 1; n type pillar layers 2 and p type pillar layers 3 which constitute a super-junction structure on the $n^+$ type drain layer 1 of the device section, each of which has a column-shaped sectional structure by stacking and integrated unit n type pillar layers and unit p type pillar layers, respectively, and which are alternately disposed in a horizontal direction; p type base layers 4 which are formed on surface portions of the p type pillar layers 3; $n^+$ type source layers 5 formed on a surface portion of the p type base layers 4; gate electrodes 8, each formed through a gate insulating film 7 over a region from one of the $n^+$ type source layers 5 formed on the surface portion of one of the p type base layers 4 to the other of the $n^+$ type source layers 5 formed on the surface portion of the other of the p type base layers 4 adjacent to the one of the p type base layers 4 via one of the n type pillar layers 2; an outermost n type pillar layer 17 which has a column-shaped sectional structure by stacking and integrated outermost unit n type pillar layers formed with a density lower than that of the unit n type pillar layers and the unit p type pillar layers constituting each of the n type pillar layers 2 and each of the p type pillar layers 3 and which is additionally formed at an outermost portion of the super-junction structure of the device section nearest to the device termination section; a high resistance n type layer 18 which is formed on the $n^+$ type drain layer 1 of the device termination section adjacent to the device section and which has a resistance value higher than that of each of the n type pillar layers 2, the p type pillar layers 3 and the p type base layers 4; an insulating film 16 which is formed so as to cover the high resistance n type layer 12 and one of the p type base layers 4 positioned in the boundary portion between the device section and the device termination section and such that a film thickness of the insulating film 16 gradually becomes thicker toward a peripheral portion of the device; a source electrode 6 which is formed to be electrically connected with the p type base layers 4 and the $n^+$ type source layers 5; a field plate electrode 15 which is formed so as to expand the source electrode 6 up to the device termination section and to cover the insulating film 16; and a drain electrode 9 which is formed on a back face of the $n^+$ type drain layer 1.

The n type pillar layers 2 and the p type pillar layers 3 constituting the super-junction structure of the device section are formed by ion implantation and embedding crystalline growth, and the outermost n type pillar layer 17 additionally formed to the outermost portion of the super-junction structure of the device section nearest to the device termination section is also formed by ion implantation and embedding crystalline growth.

In the structure of the power semiconductor device according to the fourth embodiment of the present invention, the outermost unit n type pillar layers constituting the outermost n type pillar layer 17 are embedded at periods or intervals longer than those of the unit n type pillar layers or the unit p type pillar layers constituting each n type pillar layer 2 or each p type pillar layer 3 of the device section, therefore, at a density lower than that in the n type pillar layer 2 or the p type pillar layer 3. In the embodiment shown in FIG. 7, the outermost unit n type pillar layers constituting the outermost n type pillar layer 17 are embedded at periods of about two times those of the unit n type pillar layers or the unit p type pillar layers constituting each n type pillar layer 2 or each p type pillar layer 3 of the device section, therefore, at a density of about half of that in the n type pillar layer 2 or the p type pillar layer 3. That is, in a manufacturing process for ion implantation and embedding crystalline growth, the outermost unit n type pillar layers constituting the outermost n type pillar layer 17 are formed in an embedding manner alternatively.

The stacked unit n type pillar layers and the stacked unit p type pillar layers constituting the n type pillar layer 2 and the p type pillar layer 3, and the stacked outermost unit n type pillar layers constituting the outermost n type pillar layer 17 constitute an integrated n type pillar layer 2 and an integrated p type pillar layer 3, and an integrated outermost n type pillar layer 17 through a diffusion step, respectively. Accordingly, a portion between one p type base layer 4 and another p type base layer 4 in FIG. 7 constitutes a portion of the integrated n type pillar layer 2 through a diffusion step.

Since the integrated n type pillar layer 2 and the integrated p type pillar layer 3, and the integrated outermost n type pillar layer 17 are respectively formed as the stacked unit n type pillar layers and the stacked unit p type pillar layers, and the stacked outermost unit n type pillar layers before they are subjected to diffusion step, and the impurity concentrations thereof vary periodically in a vertical direction. The period of the fluctuation of the impurity concentration in the outermost n type pillar layer 17 is longer than that in each of the n type pillar layer 2 and the p type pillar layer 3, and the former is about two times the latter in the embodiment shown in FIG. 7.

By making the density of the outermost unit n type pillar layers constituting the outermost n type pillar layer 17 lower than that of each of the unit n type pillar layers and the unit p type pillar layers constituting the n type pillar layer 2 and the p type pillar layer 3 in this manner, the entire impurity concentration in the outermost n type pillar layer 17 can be made lower than the entire impurity concentration of each of the n type pillar layer 2 and the p type pillar layer 3.

Therefore, according to the power semiconductor device according to the fourth embodiment of the present invention, since adjustment of the impurity concentration in the outermost n type pillar layer 17 is made according to presence/absence of embedding of the outermost unit n type pillar layer, an ideal termination of a super-junction structure can be realized without being subjected to an opening width of a mask for ion implantation and a fluctuation of a size conversion difference thereof.

Figure 8:
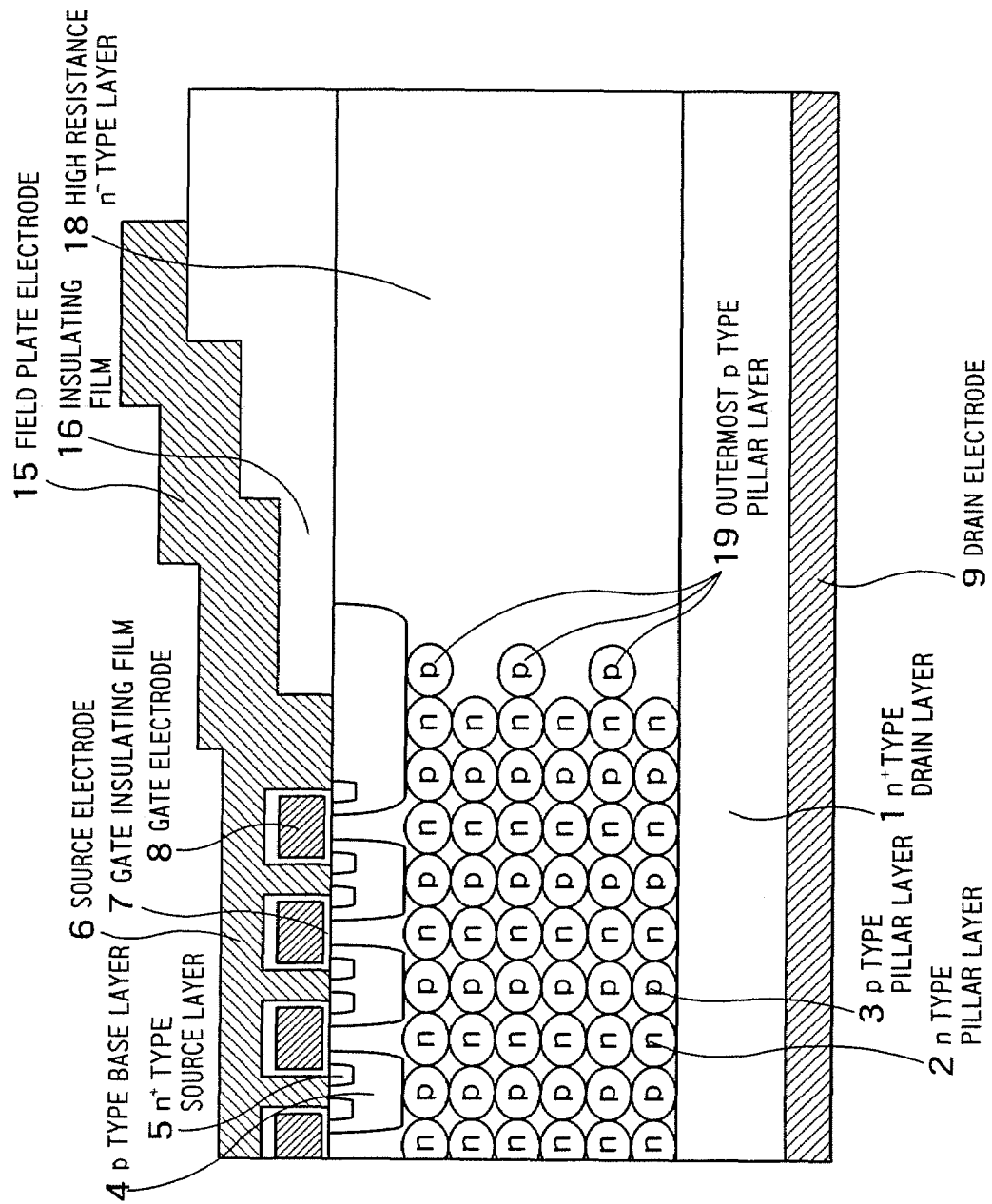
FIG. 8 is a sectional view showing a structure of a first modification of a power semiconductor device according to the fourth embodiment of the present invention.

FIG. 8 is a sectional view showing a structure of a first modification of a power semiconductor device according to the fourth embodiment of the present invention.

The first modification of the power semiconductor device according to the fourth embodiment of the present invention is constituted such that a conductive type of the outermost pillar layer is not n type but p type, and it is therefore different from the power semiconductor device according to the fourth embodiment of the present invention shown in FIG. 7 only in that an outermost p type pillar layer 19 is provided as the outermost pillar layer.

The same advantage can be obtained regardless of whether the conductive type of the outermost pillar layer is n type or p type.

Figure 9:
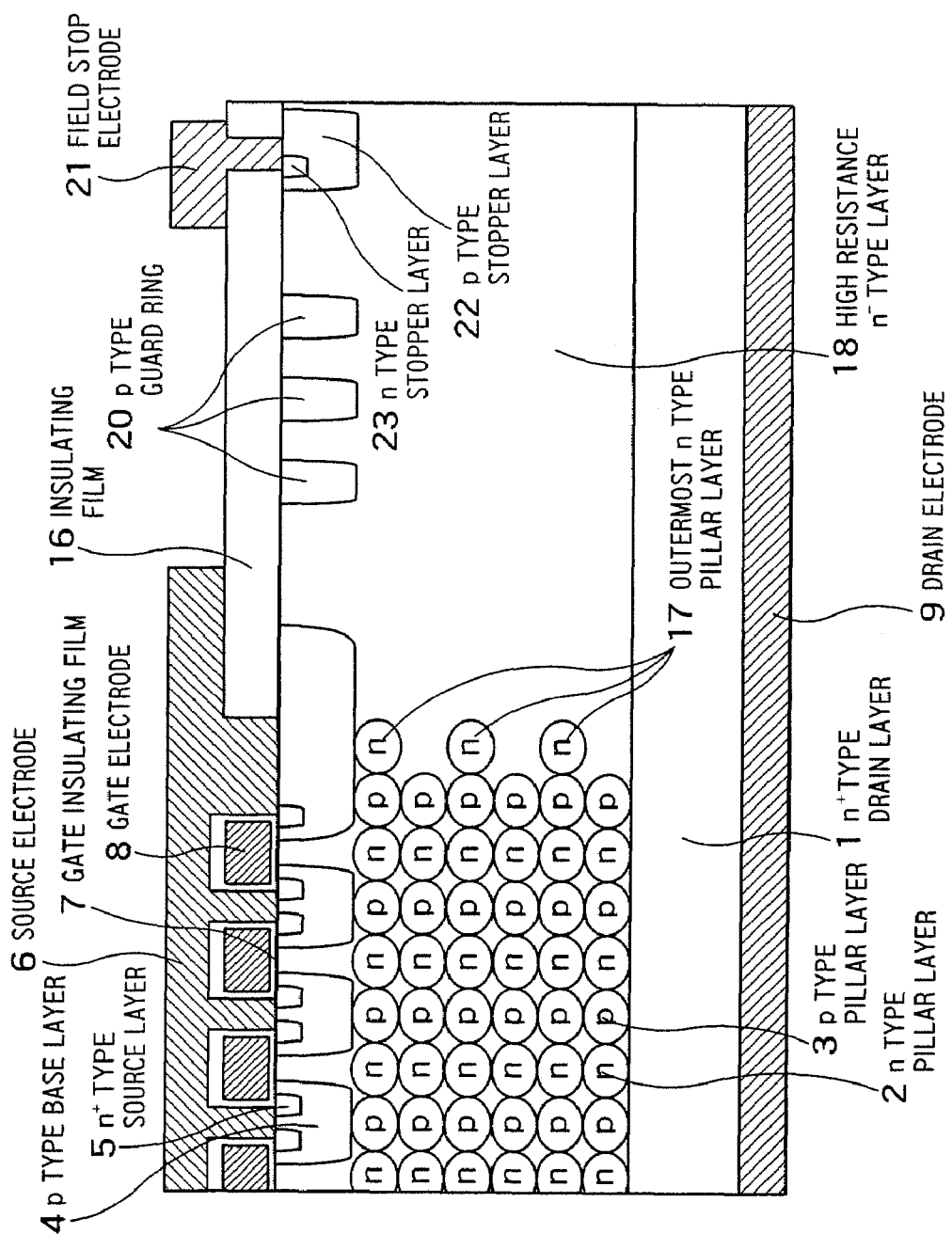
FIG. 9 is a sectional view showing a structure of a second modification of a power semiconductor device according to the fourth embodiment of the present invention.

FIG. 9 is a sectional view showing a structure of a second modification of a power semiconductor device according to the fourth embodiment of the present invention.

The second modification of the power semiconductor device according to the fourth embodiment of the present invention comprises: an n$^+$ type drain layer 1; n type pillar layers 2 and p type pillar layers 3 which constitute a super-junction structure on the n$^+$ type drain layer 1 of the device section, each of which has a column-shaped sectional structure by stacking and integrated unit n type pillar layers and unit p type pillar layers, respectively, and which are alternately disposed in a horizontal direction; p type base layers 4 which are formed on surface portions of the p type pillar layers 3; n$^+$ type source layers 5 formed on a surface portion of the p type base layers 4; gate electrodes 8, each formed through a gate insulating film 7 over a region from one of the n$^+$ type source layers 5 formed on the surface portion of one of the p type base layers 4 to the other of the n$^+$ type source layers 5 formed on the surface portion of the other of the p type base layers 4 adjacent to the one of the p type base layers 4 via one of the n type pillar layers 2; an outermost n type pillar layer 17 which has a column-shaped sectional structure by stacking and integrated outermost unit n type pillar layers formed with a density lower than that of the unit n type pillar layers and the unit p type pillar layers constituting each of the n type pillar layers 2 and each of the p type pillar layer 3 and which is additionally formed at an outermost portion of the super-junction structure of the device section nearest to the device termination section; a high resistance n type layer 18 which is formed on the n$^+$ type drain layer 1 of the device termination section adjacent to the device section and which has a resistance value higher than that of each of the n type pillar layers 2, the p type pillar layer 3 and the p type base layers 4; p type guard rings 20 which are formed on a surface portion of the high resistance n type layer 18; a p type stopper layer 22 which is formed on the surface portion of the high resistance n type layer 18 in the vicinity of a peripheral portion thereof; an n type stopper layer 23 which is formed on a surface portion of the p type stopper layer 22; an insulating film 16 which is formed to cover the high resistance n type layer 18, the p type guard rings 20, and one of the p type base layers 4 positioned in a boundary portion between the device section and the device termination section; a source electrode 6 which is formed to be electrically connected with the p type base layers 4 and the n$^+$ type source layers 5; a field stop electrode 21 which is formed so as to be electrically connected to the p type stopper layer 22 and the n type stopper layer 23 through an opening formed in the insulating film 16; and a drain electrode 9 which is formed on a back face of the n$^+$ type drain layer 1.

In the power semiconductor device according to the fourth embodiment of the present invention, since the entire device termination section is constituted of the high resistance n type layer 18, a high breakdown voltage can be maintained even in a structure where the p type guard rings 20 are formed on the surface portion of the high resistance n type layer 18. The second modification shown in FIG. 9 illustrates such an embodiment.

Though not specifically illustrated, a structure where a guard ring(s) is formed like the second modification shown in FIG. 9 can be implemented even in an termination structure having a RESURF layer.

Though the embodiments of the power semiconductor device according to the present invention have been explained, the present invention is not limited to the respective embodiments.

For example, explanation has been made assuming that the first conductive type is n type and the second conductive type is p type, but the present invention can be implemented even in a structure where the first conductive type is p type and the second conductive type is n type.

The first to third embodiments have been explained assuming that the conductive type of the outermost pillar layer additionally formed at the outermost portion of the super-junction structure of the device section is p type, but a similar advantage can be obtained according to a similar design even in such a structure that the conductive type of the outermost pillar layer is n type.

A plane pattern of the gate portion of MOSFET or the super-junction structure is not limited to a stripe pattern but it may be a grating pattern or a staggered pattern.

Explanation has been made assuming that the gate structure of MOSFET is the planer structure, but the present invention can be implements even in a constitution where the gate structure is a trench structure.

The embodiment of MOSFET where silicon (Si) is used as the semiconductor has been explained, but compound semiconductor such as, for example, silicon carbide (SiC) or gallium nitride (GaN) or wide band gap semiconductor such as diamond can be used as the semiconductor in this invention.

The embodiment of MOSFET having the super-junction structure has been explained, but the structure of the present invention can be applied to such a device as a Schottky barrier diode (SBD), a mixed device of MOSFET and SBD, a static induction transistor (SIT), an insulated gate bipolar transistor (IGBT), when the device has a super-junction structure.

As explained above, the power semiconductor device according to each embodiment of the present invention provides a power semiconductor device having a super-junction structure where lowering of a breakdown voltage to fluctuation on a manufacturing process is suppressed and a low ON resistance can be achieved.

What is claimed is:

1. A power semiconductor device comprising:
   a drain layer of a first conductive type;
   first pillar layers of the first conductive type and second pillar layers of a second conductive type which constitute a super-junction structure on said drain layer of a device section and which arranged alternately in a horizontal direction, each of said first and second pillar layers having a column-shaped sectional structure;
   base layers of the second conductive type which are formed on surface portions of said second pillar layers;
   source layers of the first conductive type formed on a surface portion of said base layers;
   gate electrodes, each formed through a gate insulating film over a region from one of said source layers formed on the surface portion of one of said base layer to the other of said source layers formed on the surface portion of the other of said base layer adjacent to the one of said base via one of said first pillar layers;
   third pillar layers of the first conductive type and fourth pillar layers of the second conductive type which are adjacent to the super-junction structure of the device section to constitute another super-junction structure thinner in a vertical direction than the super-junction structure of the device section on said drain layer of a device termination section and which are arranged alternately in a horizontal direction, each of said third and fourth pillar layers having a column-shaped sectional structure;
   an outermost pillar layer which is stacked on one of said third or fourth pillar layers in the super-junction structure of the device termination section nearest to the device section to be additionally formed to an outermost portion of the super-junction structure of the device section nearest to the device termination section and which has an impurity concentration less than that of each of said first and second pillar layers;
   a high resistance layer of the first conductive type which is formed on said third pillar layers and said fourth pillar layers and has a resistance value higher than that of each of said first and second pillar layers and said base layers;
   a source electrode which is formed to be electrically connected with said base layers and said source layers; and
   a drain electrode which is formed on a back face of said drain layer.

2. The power semiconductor device according to claim 1, wherein the impurity concentration in said outermost pillar layer is 0.45 time to 0.55 time the impurity concentration of each of said first and second pillar layers.

3. The power semiconductor device according to claim 1, wherein said high resistance layer is thicker than said base layers.

4. The power semiconductor device according to claim 1, wherein the thickness of said outermost pillar layer in the horizontal direction is about half of the thickness of each of said first and second pillar in the horizontal direction.

5. The power semiconductor device according to claim 1, wherein the thickness of said high resistance layer is smaller than that of each of said first and second pillar layers in the vertical direction.

6. The power semiconductor device according to claim 1, further comprising a RESURF (Reduced Surface Field) layer formed on a surface portion of said high resistance layer.

7. The power semiconductor device according to claim 1, further comprising:
   an insulating film which covers said high resistance layer, and a portion of one of said base layers positioned in a boundary portion between the device section and the device termination section; and
   a field plate electrode which is formed so as to extend said source electrode up to the device termination section and cover said insulating film.

8. The power semiconductor device according to claim 7, wherein said insulating film is formed such that a film thickness thereof gradually becomes thicker toward a peripheral portion of the device.

9. The power semiconductor device according to claim 1, wherein each of said third and fourth pillar layers has an impurity concentration lower than that of each of said first and second pillar layers.

10. The power semiconductor device according to claim 1, wherein a conductive type of said outermost pillar layer is the first conductive type.

11. The power semiconductor device according to claim 1, wherein a conductive type of said outermost pillar layer is the second conductive type.

* * * * *